United States Patent
Zhang

(10) Patent No.: US 11,055,606 B2
(45) Date of Patent: Jul. 6, 2021

(54) VERTICALLY INTEGRATED NEURO-PROCESSOR

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., Zhejiang (CN); Guobiao Zhang, Corvallis, OR (US)

( * ) Notice: Subject to any disclaimer, the term of this patent is extended or adjusted under 35 U.S.C. 154(b) by 299 days.

(21) Appl. No.: 16/249,112

(22) Filed: Jan. 16, 2019

(65) Prior Publication Data

US 2019/0164038 A1    May 30, 2019

Related U.S. Application Data

(63) Continuation-in-part of application No. 15/464,347, filed on Mar. 21, 2017.

(30) Foreign Application Priority Data

| Mar. 21, 2016 | (CN) | 201610162375.7 |
| Mar. 26, 2016 | (CN) | 201610180422.0 |
| Mar. 27, 2016 | (CN) | 201610182229.0 |
| Apr. 27, 2018 | (CN) | 201810388183.7 |
| Apr. 27, 2018 | (CN) | 201810395481.9 |
| Jan. 13, 2019 | (CN) | 201910029526.5 |

(51) Int. Cl.
| *G06N 3/063* | (2006.01) |
| *G06F 11/14* | (2006.01) |
| *G11C 11/21* | (2006.01) |
| *A61B 5/00* | (2006.01) |
| *G06N 3/04* | (2006.01) |

(52) U.S. Cl.
CPC ............. *G06N 3/04* (2013.01); *G06N 3/063* (2013.01)

(58) Field of Classification Search
CPC .................................. G06N 3/04; G06N 3/063
USPC ........................................................ 706/1–62
See application file for complete search history.

(56) References Cited

U.S. PATENT DOCUMENTS

| 5,835,396 | A  | 11/1998 | Zhang |
| 6,034,882 | A  | 3/2000  | Johnson et al. |
| 6,067,536 | A  | 5/2000  | Maruyama et al. |
| 6,199,057 | B1 | 3/2001  | Tawel |
| 6,717,222 | B2 | 4/2004  | Zhang |
| 6,861,715 | B2 | 3/2005  | Zhang |
| 7,450,414 | B2 | 11/2008 | Scheuerlein |
| 8,700,552 | B2 | 4/2014  | Yu et al. |
| 9,153,230 | B2 | 10/2015 | Maaninen |

(Continued)

OTHER PUBLICATIONS

Chen et al. "DaDianNao: A Machine-Learning Supercomputer", IEEE/ACM International Symposium on Micro-architecture, 5(1), pp. 609-622, 2014.

*Primary Examiner* — Brandon S Cole

(57) ABSTRACT

A vertically integrated neuro-processor comprises a plurality of neural storage-processing units (NSPU's). Each NSPU comprises at least a neuro-storage circuit and a neuro-processing circuit. The neuro-storage circuit comprises a memory array for storing at least a synaptic weight, while the neuro-processing circuit performs neural processing with the synaptic weight. The memory array and the neuro-processing circuit are vertically stacked and communicatively coupled by a plurality of inter-level connections.

8 Claims, 14 Drawing Sheets

(56) References Cited

U.S. PATENT DOCUMENTS

| | | | |
|---|---|---|---|
| 2009/0175104 A1* | 7/2009 | Leedy | H01L 27/0688 |
| | | | 365/200 |
| 2014/0355381 A1* | 12/2014 | Lal | G06N 3/0635 |
| | | | 367/87 |
| 2015/0170021 A1* | 6/2015 | Lupon | G06N 3/063 |
| | | | 706/15 |
| 2015/0339570 A1* | 11/2015 | Scheffler | G06N 3/04 |
| | | | 706/16 |
| 2017/0329548 A1* | 11/2017 | Zhang | G06F 3/0617 |

* cited by examiner

VERTICALLY INTEGRATED NEURO-PROCESSOR

CROSS-REFERENCE TO RELATED APPLICATIONS

This application is a continuation-of-part of application "Integrated Neuro-Processor Comprising Three-Dimensional Memory Array", application Ser. No. 15/464,347, filed Mar. 21, 2017, which claims priorities from Chinese Patent Application No. 201610162375.7, filed Mar. 21, 2016; Chinese Patent Application No. 201610180422.0, filed Mar. 26, 2016; Chinese Patent Application No. 201610182229.0, filed Mar. 27, 2016, in the State Intellectual Property Office of the People's Republic of China (CN), the disclosures of which are incorporated herein by references in their entireties.

This application claims priorities from Chinese Patent Application No. 201810388183.7, filed Apr. 27, 2018; Chinese Patent Application No. 201810395481.9, filed Apr. 27, 2018; Chinese Patent Application No. 201910029526.5, filed Jan. 13, 2019; Chinese Patent Application No. 201910029527.X, filed Jan. 13, 2019; Chinese Patent Application No. 201910029528.4, filed Jan. 13, 2019, in the State Intellectual Property Office of the People's Republic of China (CN), the disclosures of which are incorporated herein by references in their entireties.

BACKGROUND

1. Technical Field of the Invention

The present invention relates to the field of integrated circuit, and more particularly to a neuro-processor for artificial intelligence (AI) applications.

2. Prior Art

Neural network is a powerful tool for artificial intelligence (AI). An exemplary neural network is shown in FIG. 1A. It includes an input layer 32, a hidden layer 34 and an output layer 36. The input layer 32 comprises i neurons 33, whose input data $x_1, \ldots, x_i$ form an input vector 30x. The output layer 36 comprises k neurons 37, whose output data $y_1, y_2, \ldots y_k$ form an output vector 30y. The hidden layer 34 is between the input layer 32 and the output layer 36. It comprises j neurons 35, each of which is coupled with a first neuron in the input layer 32 as well as a second neuron in the output layer 36. The couplings between neurons are represented by synaptic weights $w_{ij}$ and $w_{jk}$.

A machine-learning supercomputer comprising a plurality of accelerator dice 60 is disclosed in prior art (referring to Chen et al. "DaDianNao: A Machine-Learning Supercomputer", IEEE/ACM International Symposium on Microarchitecture, 5(1), pp. 609-622, 2014). Each accelerator die 60 comprises an array of sixteen tiles 50, which are connected through a fat tree (FIG. 1B). Each tile 50 comprises a neuro-processing unit (NPU) 30 and four eDRAM banks 40 (FIG. 1C). The NPU 30 performs neural processing. It comprises 256+32 16-bit multipliers as well as 256+32 16-bit adders. The eDRAM 40 stores the synaptic weights. It has a storage capacity of 2 MB.

The accelerator 60 has several drawbacks. First of all, because the eDRAM 40 is a volatile memory, the synaptic weights need to be loaded into the eDRAM 40 before operations. This takes time. Secondly, each accelerator die 60 contains 32 MB eDRAM. This number is still quite small for many neural networks. Thirdly, the accelerator 60 adopts an asymmetric architecture where the tile area is heavily biased towards storage rather than computation. Inside each tile, eDRAM 40 occupies nearly 80% of the area, whereas the NPU 30 only occupies less than 10%. As a result, the computational density is limited.

A root cause of the above issues is that the integration between the eDRAM 40 and the NPU 50 is two-dimensional (2-D), i.e. both are formed at a same physical level (i.e. on the substrate). This 2-D integration leads a dilemma: more computational power per die area means less eDRAM 40 on an accelerator die 60; however, the resulting extra external-memory accesses would void much of the performance gain from the increased computational power. As long as the 2-D integration is used, this dilemma would remain. A fundamentally different integration is desired.

OBJECTS AND ADVANTAGES

It is a principle object of the present invention to advance the art of neural networks.

It is a further object of the present invention to improve the speed and efficiency of neural processing.

It is a further object of the present invention to improve computational density of a neuro-processor.

It is a further object of the present invention to improve storage density of a neuro-processor.

It is a further object of the present invention to provide a neuro-processor suitable for mobile applications.

In accordance with these and other objects of the present invention, the present invention discloses a vertically integrated neuro-processor.

SUMMARY OF THE INVENTION

The present invention discloses a vertically integrated neuro-processor. It not only performs neural processing, but also stores the synaptic weights used therewith. The neuro-processor comprises a plurality of neural storage-processing units (NSPU's). Each of the NSPU's comprises at least a neuro-storage circuit on a memory level and a neuro-processing circuit on a logic level. The neuro-storage circuit stores at least a portion of a synaptic weight, the neuro-processing circuit performs neural processing with the synaptic weight.

In the preferred neuro-processor, the logic level and the memory level are different physical levels; and, the neuro-storage circuit and the neuro-processing circuit are vertically stacked. This type of integration is referred to as vertical integration. The vertical integration has a profound effect on the computational density. Because the neuro-storage circuit and the neuro-processing circuit are vertically stacked, the footprint of an NSPU is roughly equal to that of the neuro-processing circuit. This is significantly smaller than the conventional 2-D integration, where the footprint of the tile 50 (equivalent to the NSPU) is roughly equal to the sum of those of the eDRAM 40 (equivalent to the neuro-storage circuit) and the NPU 30 (equivalent to the neuro-processing circuit). Recalling that the NPU 30 occupies less than 10% of the tile area and the eDRAM 40 occupies ~80% of the tile area, it can be concluded that, after moving the neuro-storage circuit from aside to above, the NSPU could be ~10× smaller than the tile 50 of prior art. Because it could contain ~10× more NSPU's per die area than prior art, the preferred vertically integrated neuro-processor is ~10× more computationally powerful and therefore, supports massive parallelism.

The vertical integration also has a profound effect on the storage density, too. Because the neuro-storage circuit could comprise a plurality of memory levels (e.g. 4 memory levels) whereas the eDRAM 40 in the conventional accelerator 60 comprises only a single memory level, the vertically integrated neuro-processor has a significantly larger storage density. Because a single or few neuro-processor dice can store the synaptic weights of a whole neural network, the vertically integrated neuro-processor is suitable for mobile applications.

Accordingly, the present invention discloses a vertically integrated neuro-processor, comprising: a plurality of neural storage-processing units (NSPU's), each of said NSPU's comprising at least a neuro-storage circuit and a neuro-processing circuit, wherein said neuro-storage circuit comprises at least a memory array for storing at least a portion of a synaptic weight, and said neuro-processing circuit performs neural processing with said synaptic weight; a memory level and a logic level, wherein said memory array is disposed on said memory level, said neuro-processing circuit is disposed on said logic level, said memory level and said logic level are vertically stacked and communicatively coupled by a plurality of inter-level connections.

BRIEF DESCRIPTION OF THE DRAWINGS

FIG. 6A is its perspective view of a first side; FIG. 6B is its perspective view of a second side; FIG. 6C is its cross-sectional view;

Figure 1A:
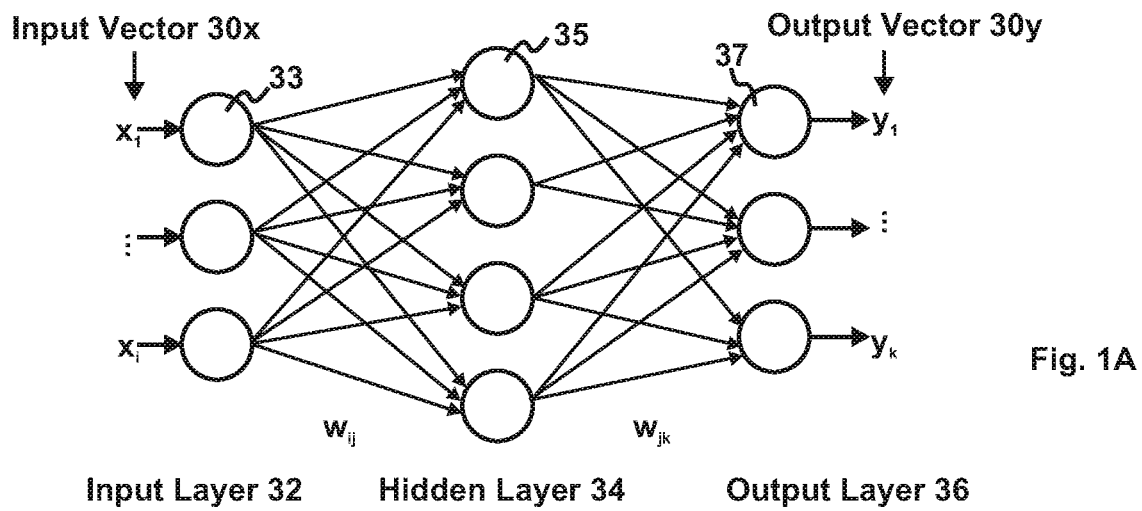
FIG. 1A is a schematic view of a neural network.
Figure 1B:
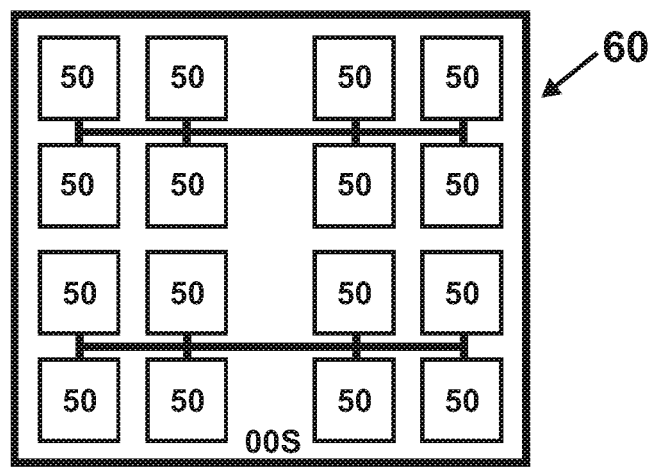
FIG. 1B shows the tile organization of an accelerator used in a machine-learning supercomputer (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

As used hereinafter, the symbol "/" means the relationship of "and" or "or". The phrase "memory" is used in its broadest sense to mean any semiconductor device, which can store information for short term or long term. The phrase "memory array (e.g. 3D-M array)" is used in its broadest sense to mean a collection of all memory cells sharing at least an address line. The phrase "circuits on a substrate" is used in its broadest sense to mean that all active elements (e.g. transistors, memory cells) or portions thereof are located in the substrate, even though the interconnects coupling these active elements are located above the substrate. The phrase "circuits above a substrate" is used in its broadest sense to mean that all active elements (e.g. transistors, memory cells) are located above the substrate, not in the substrate. The phrase "communicatively coupled" is used in its broadest sense to mean any coupling whereby electrical signals may be passed from one element to another element. The phrase "look-up table (LUT)" could refer to either the data in the LUT, or the neuro-storage circuit storing the LUT (i.e. the LUT memory); the present invention does not differentiate them.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2A:
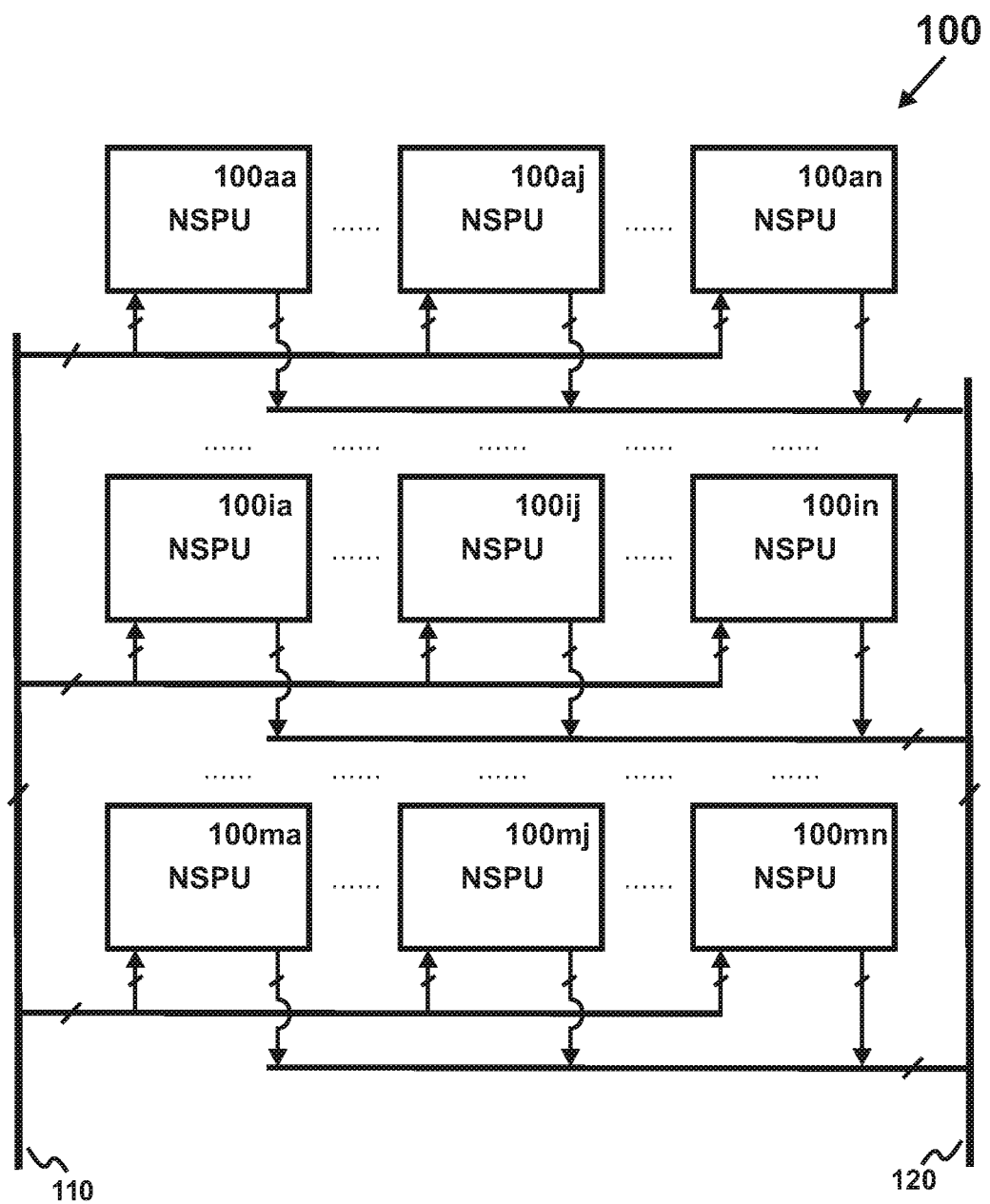
FIG. 2A is a circuit block diagram of a preferred vertically integrated neuro-processor.
Figure 2B:
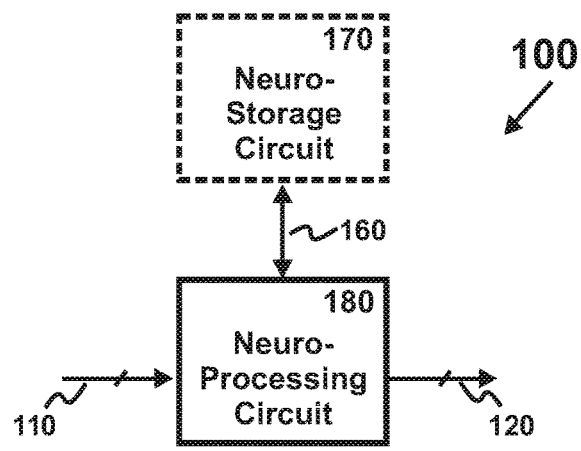
FIG. 2B is a circuit block diagram of a preferred neural storage-processing unit (NSPU)
Figure 2C:
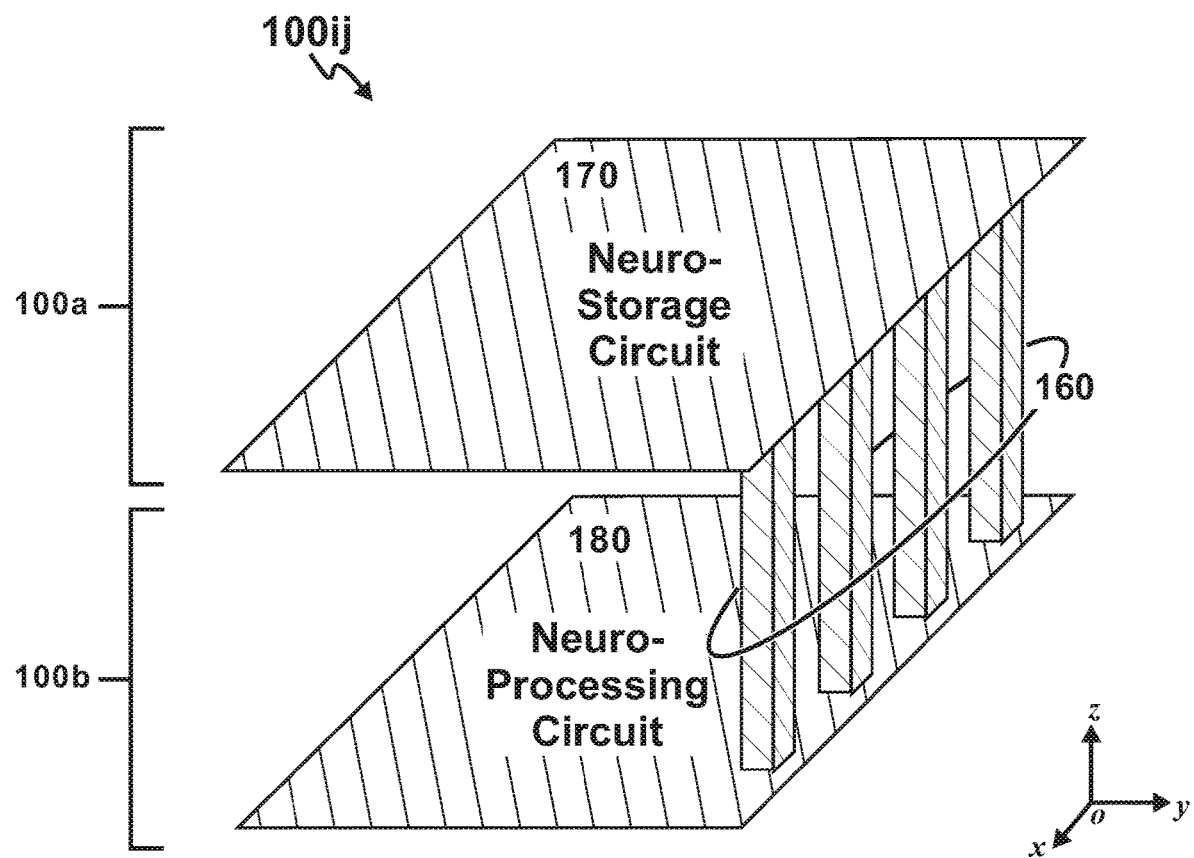
FIG. 2C is a simplified perspective view of the preferred NSPU showing its memory level and logic level.

Referring now to FIGS. 2A-2C, an overview of a preferred vertically integrated neuro-processor 100 is disclosed. FIG. 2A is its circuit block diagram. The preferred vertically integrated neuro-processor 100 not only performs neural processing, but also stores the synaptic weights used during the neural processing. The preferred vertically integrated neuro-processor 100 comprises an array with m rows and n columns (m×n) of neural storage-processing units (NSPU's) 100aa-100mn. Using the NSPU 100ij as an example, it has an input 110 and an output 120. In general, the preferred vertically integrated neuro-processor 100 comprises thousands to tens of thousands of NSPU's 100aa-100mn and therefore, supports massive parallelism.

FIG. 2B is a circuit block diagram of a preferred NSPU 100ij. The NSPU 100ij comprises a neuro-storage circuit 170 and a neuro-processing circuit 180, which are communicatively coupled by inter-level connections 160 (referring to FIG. 2C). The neuro-storage circuit 170 comprises at least a memory array for storing at least a portion of a synaptic weight, whereas the neuro-processing circuit 180 performs neural processing with the synaptic weight. Because the memory array 170 is disposed on a different level than the neuro-processing circuit 180, the memory array 170 is drawn by dashed lines.

FIG. 2C shows a simplified structure of the preferred vertically integrated neuro-processor 100. It comprises a memory level 100a and a logic level 100b. The memory array 170 is disposed on the memory level 100a, while the neuro-processing circuit 180 is disposed on the logic level 100b. The memory array 170 and the neuro-processing circuit 180 are communicatively coupled by the inter-level connections 160. In this preferred embodiment, the memory level 100a is vertically stacked above the logic level 100b. Alternatively, the logic level 100b can be vertically stacked above the memory level 100a.

Figure 3:
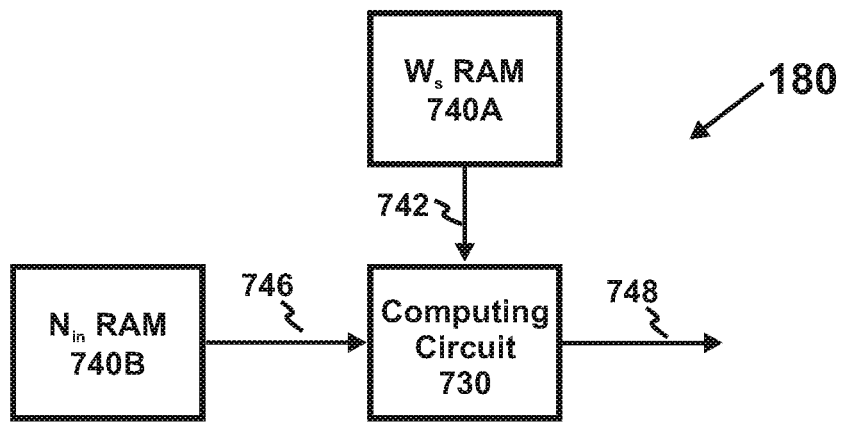
FIG. 3 is a circuit block diagram of a preferred neuro-processing circuit.

The basic function of the preferred neuro-processor 100 is neural processing, with the synaptic weights stored locally. Referring now to FIGS. 3-4B, a preferred neuro-processing circuit 180 and its computing circuit 730 are disclosed. In the preferred embodiment of FIG. 3, the preferred neuro-processing circuit 180 comprises a synaptic-weight ($w_s$) RAM 740A, an input-neuron ($N_{in}$) RAM 740B, and a computing circuit 730. The $w_s$ RAM 740A is a buffer RAM which temporarily stores the synaptic weights 742 read from the memory array 170. The $N_{in}$ RAM 740B is another buffer RAM which temporarily stores the input data 746 from the input 110. The computing circuit 730 performs neural processing before generating output data 748.

Figure 4A:
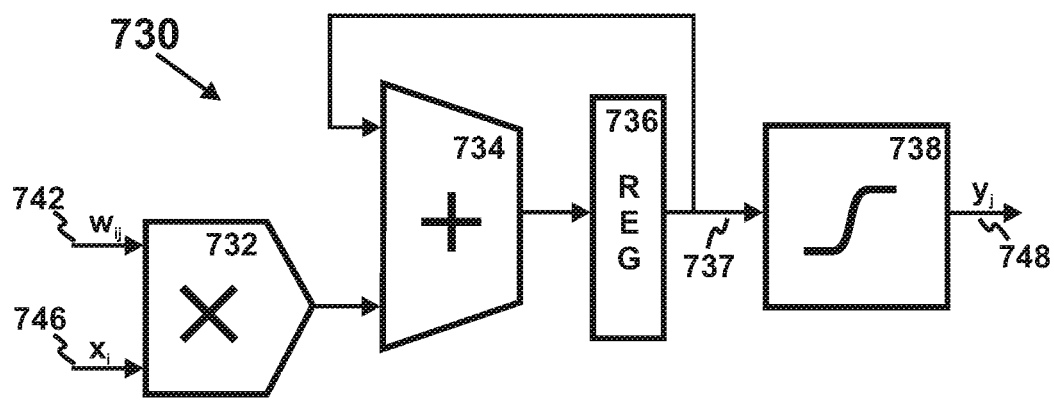
FIGS. 4A-4B are circuit block diagrams of two preferred computing circuits.
Figure 4B:
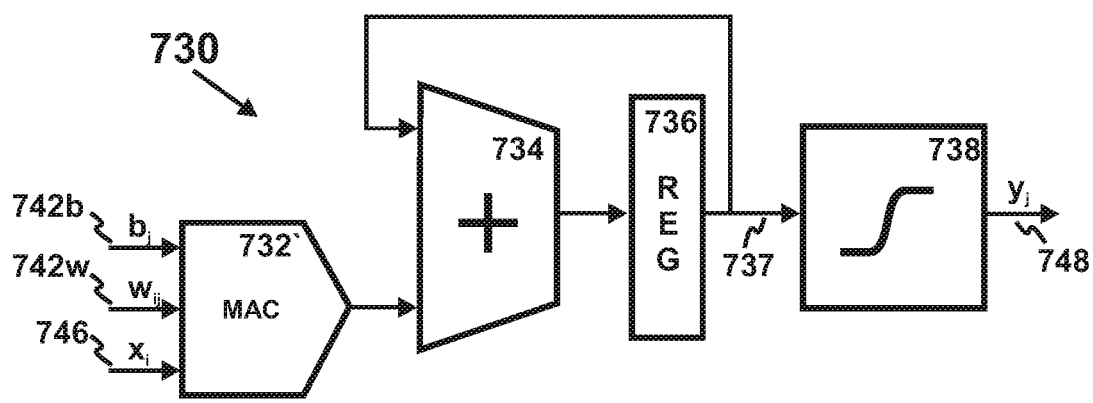

In the preferred embodiment of FIG. 4A, a first preferred computing circuit 730 comprises a multiplier 732, an adder 734, a register 736 and an activation-function circuit 738. The multiplier 732 multiplies the input data $x_i$ with the synaptic weight $w_{ij}$. Then the adder 734 and the register 736 together perform accumulative addition for the multiplication results (i.e. $w_{ij}*x_i$). The resulting accumulative sum 737 is passed through the activation-function circuit 738 to generate the output data $y_j$.

In the preferred embodiment of FIG. 4B, a second preferred computing circuit 730 comprises a multiply-accumulate circuit (MAC) 732' in place of the multiplier 732 of FIG. 26A. Of course, the MAC 732' comprises a multiplier too. The $W_s$ RAM 740A outputs not only a synaptic weight $w_{ij}$ (through port 742w), but also a bias $b_i$ (through port 742b). The MAC 732' performs a biased-multiplication (i.e. $w_{ij}*x_i+ b_j$) for the input data $x_i$, the synaptic weight $w_{ij}$ and the bias $b_j$.

The activation function (e.g. a sigmoid function, a signum function, a threshold function, a piecewise-linear function, a step function, a tanh function, etc.) controls the amplitude of its output to be between certain values (e.g. between 0 and 1 or between −1 and 1). It is difficult to realize the activation function in the past. To implement the activation function, the neuro-processing circuit 180 comprises a non-volatile memory (NVM) for storing the look-up table (LUT) of the activation function. The NVM is generally a read-only memory (ROM), more particularly a 3-D ROM (3D-ROM). The 3D-ROM array can be further stacked above the multiplier/MAC 732 and the adder 734 and overlap them. As a result, the computing circuit 730 becomes quite simple—it only needs to realize multiplication and addition, but not activation function. This leads to a smaller computing circuit 730 and therefore, a larger computational density.

Referring now to FIGS. 5A-5D, four preferred monolithically integrated neuro-processors 100 are shown. In a monolithically integrated neuro-processor 100, the memory array 170 is a three-dimensional (3D-M) array which is monolithically integrated with the neuro-processing circuit 180. To be more specific, the neuro-processing circuit 180 is formed on a semiconductor substrate 0, and the 3D-M array 170 is vertically stacked on the neuro-processing circuit 180. They are communicatively coupled by a plurality of inter-level connections 160, i.e. contact vias 1av, 3av. Note that the 3D-M arrays 170 uses monolithic integration per se, i.e. the memory cells are vertically stacked without any semiconductor substrate therebetween.

Based on its physical structure, the 3D-M can be categorized into horizontal 3D-M (3D-$M_H$) and vertical 3D-M (3D-$M_V$). In a 3D-$M_H$, all address lines are horizontal. The memory cells form a plurality of horizontal memory levels which are vertically stacked above each other. A well-known 3D-$M_H$ is 3D-XPoint. In a 3D-$M_V$, at least one set of the address lines are vertical. The memory cells form a plurality of vertical memory strings which are placed side-by-side on/above the substrate. A well-known 3D-$M_V$ is 3D-NAND. In general, the 3D-$M_H$ (e.g. 3D-XPoint) is faster, while the 3D-$M_V$ (e.g. 3D-NAND) is denser.

Based on the data storage time, the 3D-M can be categorized into 3D-RAM (random access memory) and 3D-ROM (read-only memory). The 3D-RAM can store data for short term and can be used as cache. The 3D-ROM can store data for long term. It is a non-volatile memory (NVM). Most 3D-M arrays in the present invention are 3D-ROM.

Based on the programming methods, the 3D-M can be categorized into 3-D writable memory (3D-W) and 3-D printed memory (3D-P). The 3D-W cells are electrically programmable. Based on the number of programmings allowed, the 3D-W can be further categorized into three-dimensional one-time-programmable memory (3D-OTP) and three-dimensional multiple-time-programmable memory (3D-MTP, including re-programmable). Common 3D-MTP includes 3D-XPoint and 3D-NAND. Other 3D-MTP's include memristor, resistive random-access memory (RRAM or ReRAM), phase-change memory (PCM), programmable metallization cell (PMC) memory, conductive-bridging random-access memory (CBRAM), and the like.

For the 3D-P, data are recorded into the 3D-P cells using a printing method during manufacturing. These data are fixedly recorded and cannot be changed after manufacturing. The printing methods include photo-lithography, nano-imprint, e-beam lithography, DUV lithography, and laser-programming, etc. An exemplary 3D-P is three-dimensional mask-programmed read-only memory (3D-MPROM), whose data are recorded by photo-lithography. Because a 3D-P cell does not require electrical programming and can be biased at a larger voltage during read than the 3D-W cell, the 3D-P is faster.

Figure 5A:
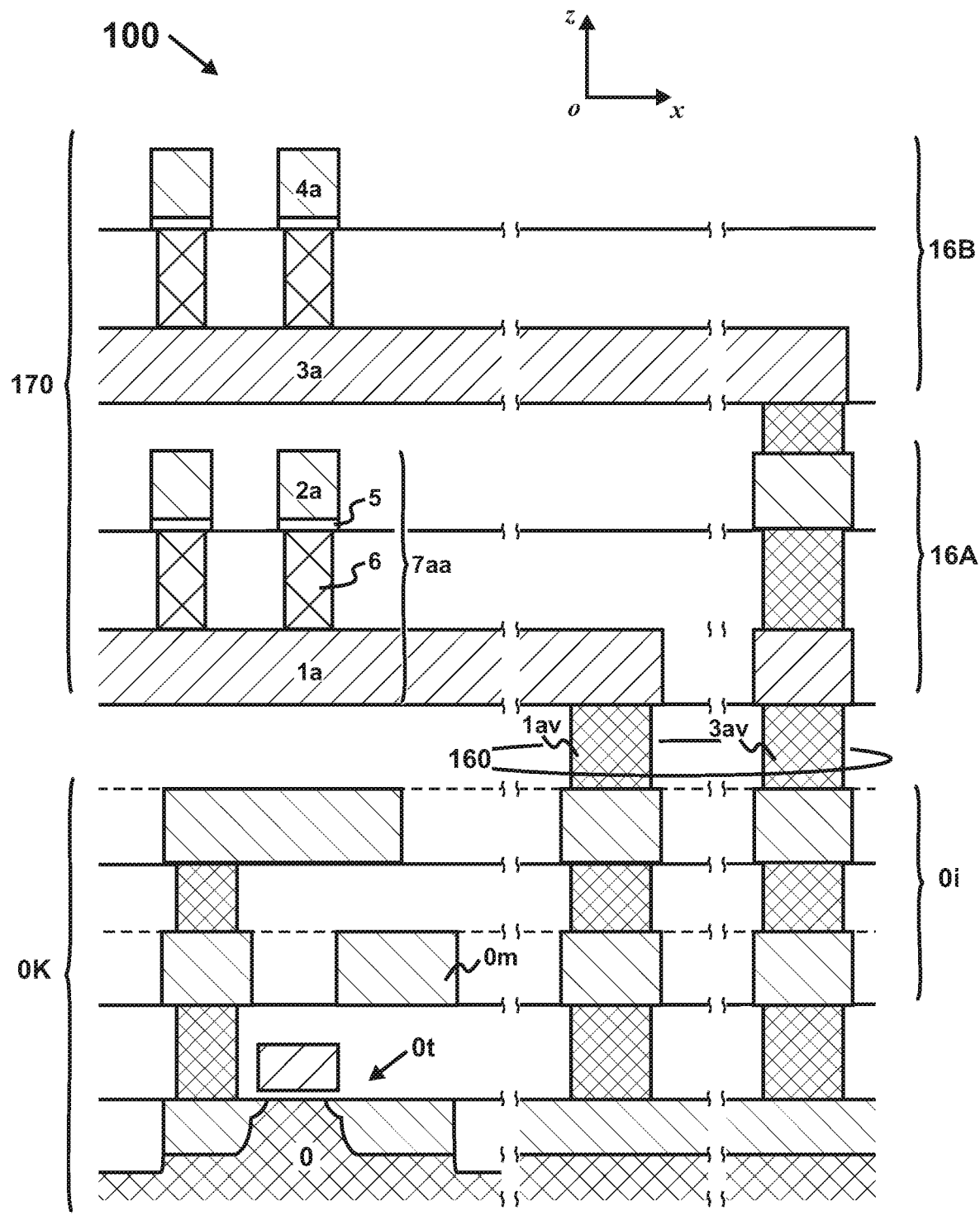
FIGS. 5A-5D are cross-sectional views of four preferred monolithically integrated neuro-processors.
Figure 5B:
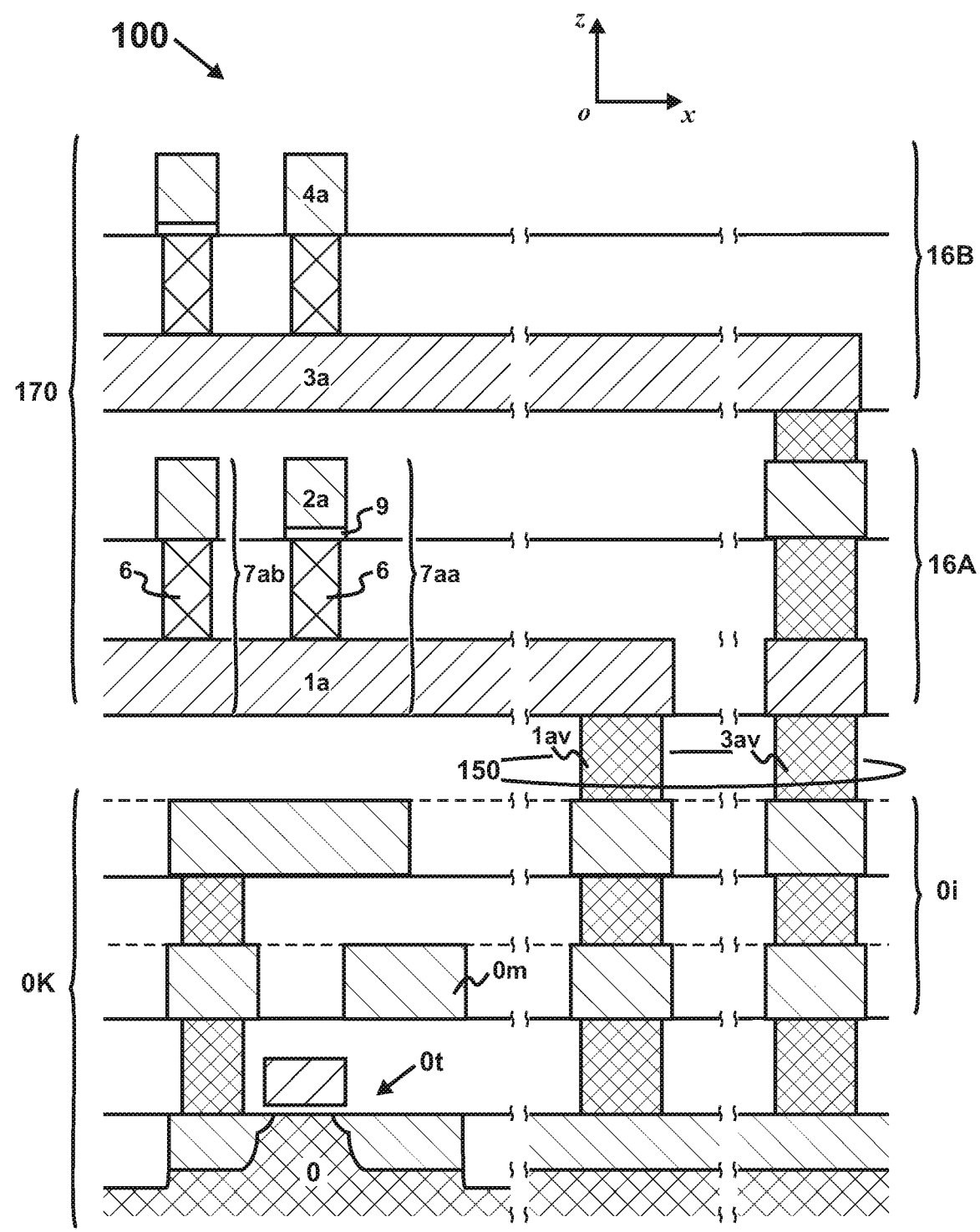

In FIGS. 5A-5B, the preferred neuro-processor 100 comprises a substrate circuit 0K and a plurality of 3D-$M_H$ arrays 170 vertically stacked thereon. The substrate circuit 0K includes transistors 0t and metal lines 0m. The transistors 0t are disposed on a first semiconductor substrate 0a. The metal lines form substrate interconnects 0i, which communicatively couple the transistors 0t. The 3D-$M_H$ array 170 includes two memory levels 16A, 16B, with the memory level 16A stacked on the substrate circuit 0K and the memory level 16B stacked on the memory level 16A. Memory cells (e.g. 7aa) are disposed at the intersections between two address lines (e.g. 1a, 2a). The memory levels 16A, 16B are communicatively coupled with the substrate circuit 0K through contact vias 1av, 3av, which form inter-level connections 160. The contact vias 1av, 3av comprise a plurality of vias, each of which penetrates through a dielectric level and communicatively couples the vias above and below.

The 3D-$M_H$ arrays 170 in FIG. 5A are 3D-W arrays. Its memory cell 7aa comprises a programmable layer 5 and a diode layer 6. The programmable layer 5 could be an antifuse layer (which can be programmed once and used for the 3D-OTP) or a resistive RAM (RRAM) layer (which can be re-programmed and used for the 3D-MTP). The diode layer 6 is broadly interpreted as any layer whose resistance at the read voltage is substantially lower than when the applied voltage has a magnitude smaller than or polarity opposite to that of the read voltage. The diode could be a semiconductor diode (e.g. p-i-n silicon diode), or a metal-oxide (e.g. $TiO_2$) diode.

The 3D-$M_H$ arrays 170 in FIG. 5B are 3D-P arrays. It has at least two types of memory cells: a high-resistance memory cell 7aa, and a low-resistance memory cell 7ac. The low-resistance memory cell 7ac comprises a diode layer 6, which is similar to that in the 3D-W; whereas, the high-resistance memory cell 5aa comprises at least a high-resistance layer 9, which could simply be a layer of insulating dielectric (e.g. silicon oxide, or silicon nitride). It can be physically removed at the location of the low-resistance memory cell 7ac during manufacturing.

Figure 5C:
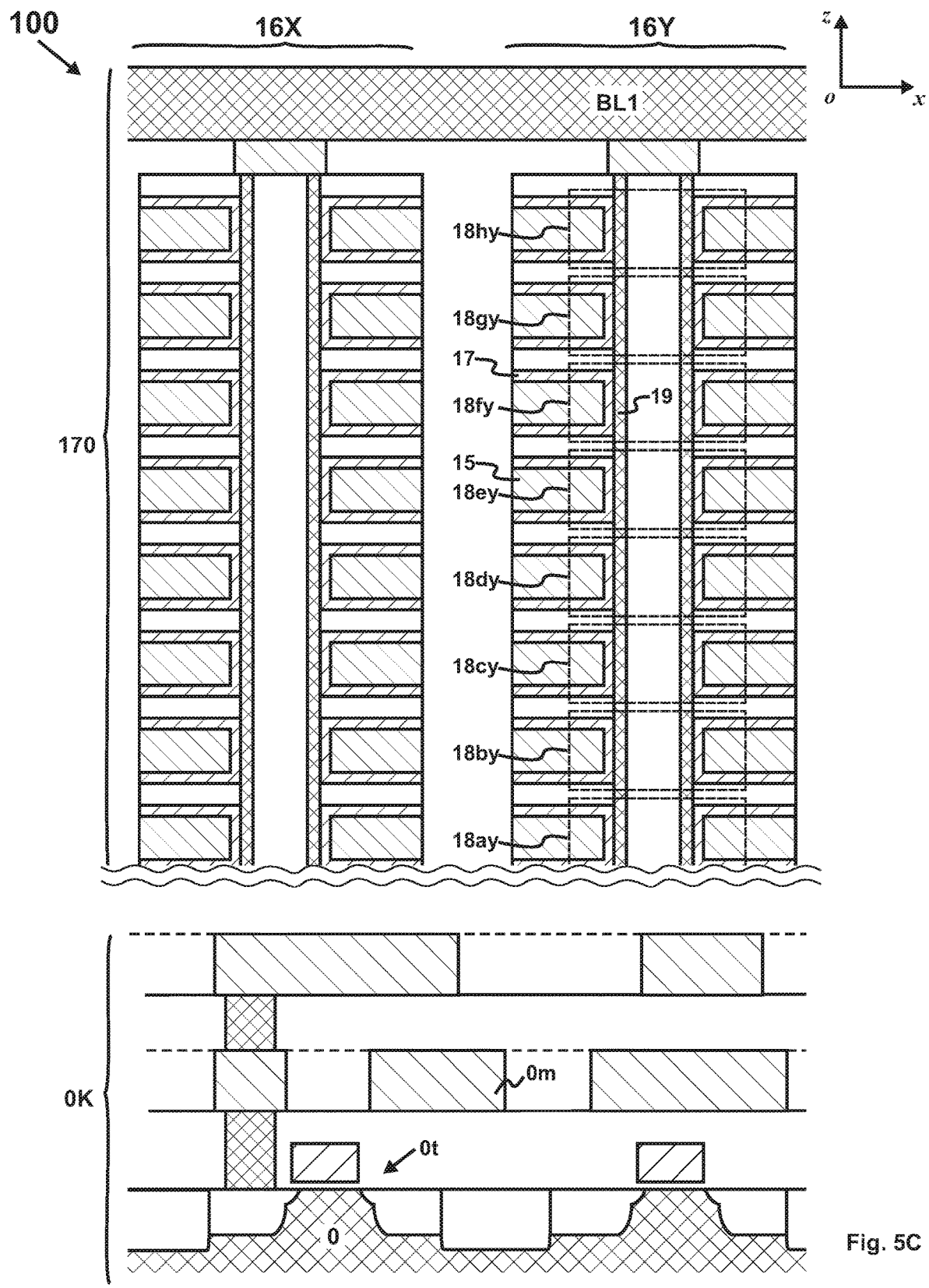
Figure 5D:
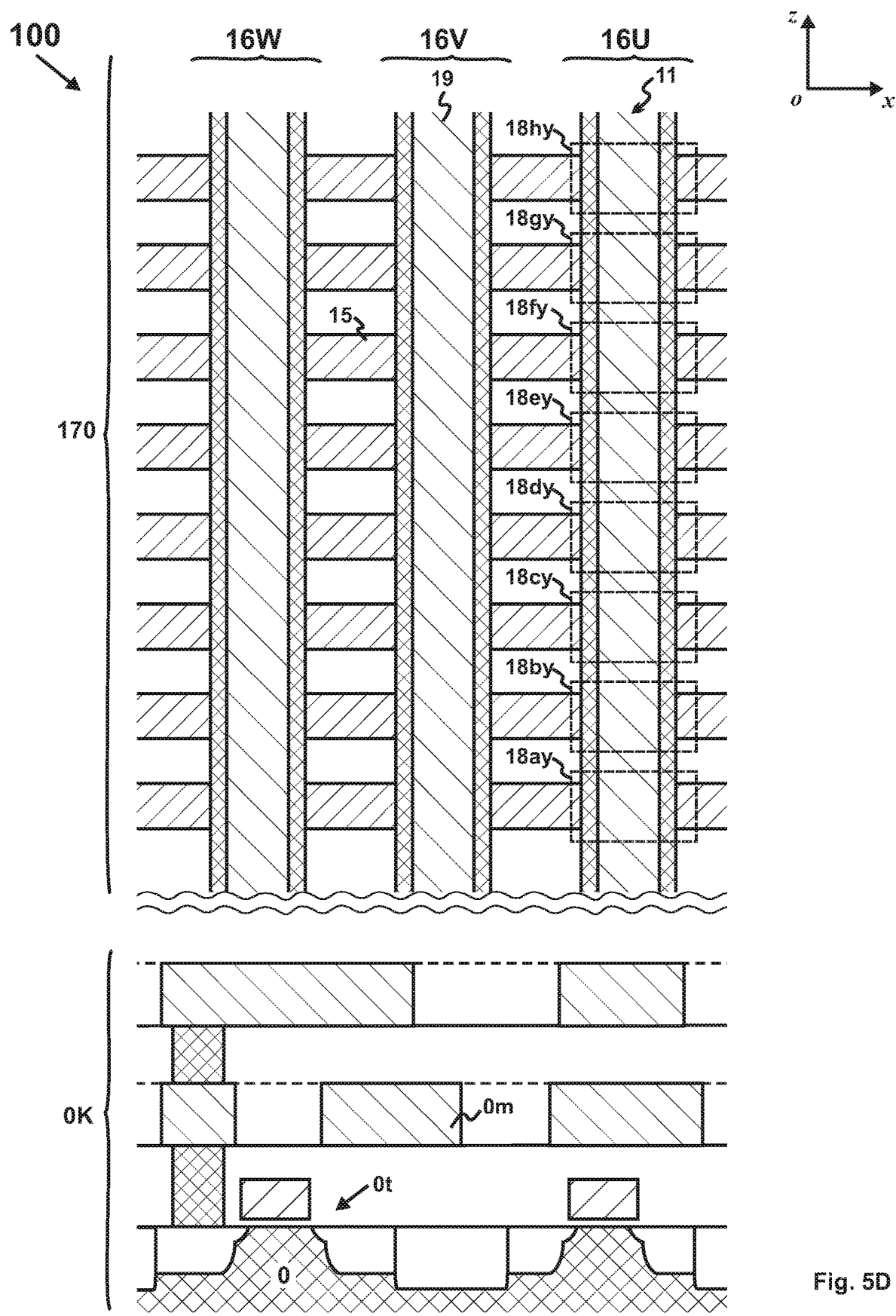

In FIGS. 5C-5D, the preferred neuro-processor 100 comprises a substrate circuit 0K and a plurality of 3D-M$_V$ arrays 170 vertically stacked thereon. The substrate circuit 0K is similar to those in FIGS. 5A-5B. In some embodiments of the 3D-M$_V$, there is no substrate circuit 0K under the 3D-M$_V$ arrays 170. The 3D-M$_V$ array 170 comprises a plurality of vertically stacked horizontal address-line layers 0a1a-0a8a. Each horizontal address-line layer (e.g. 0a5a) comprises a plurality of horizontal address lines (e.g. 15) on a same physical plane. The 3D-M$_V$ array 170 also comprises a set of vertical address lines, which are perpendicular to the surface of the substrate 0a. The 3D-M$_V$ has the largest storage density among semiconductor memories. For reason of simplicity, the inter-die connections 160 between the 3D-M$_V$ arrays 170 and the substrate circuit 0K are not shown. They are well known to those skilled in the art.

The preferred 3D-M$_V$ array 170 in FIG. 5C is based on vertical transistors or transistor-like devices. It comprises a plurality of vertical memory strings 16X, 16Y placed side-by-side. Each memory string (e.g. 16Y) comprises a plurality of vertically stacked memory cells (e.g. 18ay-18hy). Each memory cell (e.g. 18fy) comprises a vertical transistor, which includes a gate (acts as a horizontal address line) 15, a storage layer 17, and a vertical channel (acts as a vertical address line) 19. The storage layer 17 could comprise oxide-nitride-oxide layers, oxide-poly silicon-oxide layers, or the like. This preferred 3D-M$_V$ array 170 is a 3D-NAND and its manufacturing details are well known to those skilled in the art.

The preferred 3D-M$_V$ array 170 in FIG. 5D is based on vertical diodes or diode-like devices. In this preferred embodiment, the 3D-M$_V$ array comprises a plurality of vertical memory strings 16U-16W placed side-by-side. Each memory string (e.g. 16U) comprises a plurality of vertically stacked memory cells (e.g. 18au-18hu). The 3D-M$_V$ array 170 comprises a plurality of horizontal address lines (word lines) 15 which are vertically stacked above each other. After etching through the horizontal address lines 15 to form a plurality of vertical memory wells 11, the sidewalls of the memory wells 11 are covered with a programmable layer 13. The memory wells 11 are then filled with a conductive materials to form vertical address lines (bit lines) 19. The conductive materials could comprise metallic materials or doped semiconductor materials. The memory cells 18au-18hu are formed at the intersections of the word lines 15 and the bit line 19. The programmable layer 13 could be one-time-programmable (OTP, e.g. an antifuse layer) or multiple-time-programmable (MTP, e.g. an RRAM layer).

To minimize interference between memory cells, a diode is preferably formed between the word line 15 and the bit line 19. In a first embodiment, this diode is the programmable layer 13 per se, which could have an electrical characteristic of a diode. In a second embodiment, this diode is formed by depositing an extra diode layer on the sidewall of the memory well (not shown in this figure). In a third embodiment, this diode is formed naturally between the word line 15 and the bit line 19, i.e. to form a built-in junction (e.g. P-N junction, or Schottky junction). More details on the built-in diode are disclosed in U.S. patent application Ser. No. 16/137,512, filed on Sep. 20, 2018.

In the preferred embodiments of FIGS. 5A-5D, the memory array 170 (i.e. the 3D-M array comprising the memory levels 16A, 16B) and the neuro-processing circuit 180 (i.e. disposed in the substrate circuit 0K) are vertically stacked and monolithically integrated into a single die. This type of vertical integration is referred to as 3-D integration.

Figure 1C:
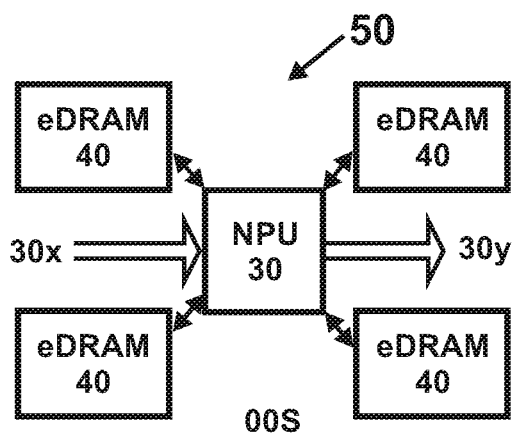
FIG. 1C shows a tile architecture of the accelerator of FIG. 1B (prior art)

The 3-D integration has a profound effect on the computational density. Because the 3D-M array 170 is vertically stacked above the neuro-processing circuit 180 (FIGS. 5A-5D), the footprint of an NSPU 100ij is roughly equal to that of the neuro-processing circuit 180. This is significantly smaller than the conventional 2-D integration, wherein the footprint of the tile 50 (equivalent to the NSPU 100ij) is roughly equal to the sum of the areas of the eDRAM 40 (equivalent to the 3D-M array 170) and the NPU 30 (equivalent to the neuro-processing circuit 180) (FIG. 1C). Recalling that the NPU 30 occupies less than 10% of the tile area and the eDRAM 40 occupies ~80% of the tile area, it can be concluded that, after moving the memory array 170 from aside to above, the NSPU 100ij could be ~10× smaller than the tile 50 of prior art. Because it could contain ~10× more NSPU's per die area than prior art, the monolithically integrated neuro-processor 100 is ~10× more computationally powerful and supports more massive parallelism.

The 3-D integration also has a profound effect on the storage density, too. Because each 3D-M cell occupies ~4F$^2$ die area whereas each eDRAM cell occupies >100F$^2$ die area (F is the minimum feature size for a processing node, e.g. 14 nm), the 3D-M is more area-efficient. Adding the fact that the 3D-M comprises multiple memory levels (e.g. eight memory levels for 3D-M$_H$; and, about one hundred memory levels for 3D-M$_V$) whereas the eDRAM comprises only a single memory level, the preferred monolithically integrated neuro-processor 100 has a significantly larger (100×) storage density than prior art. For example, since a 3D-XPoint die has a storage capacity of 128 Gb, the preferred monolithically integrated neuro-processor 100 can easily store up to 16 GB of synaptic weights. This is more than enough for most AI applications. Because a single or few monolithically integrated neuro-processor dice can store the synaptic weights of a whole neural network, the preferred monolithically integrated neuro-processor is suitable for mobile applications.

Figure 6A:
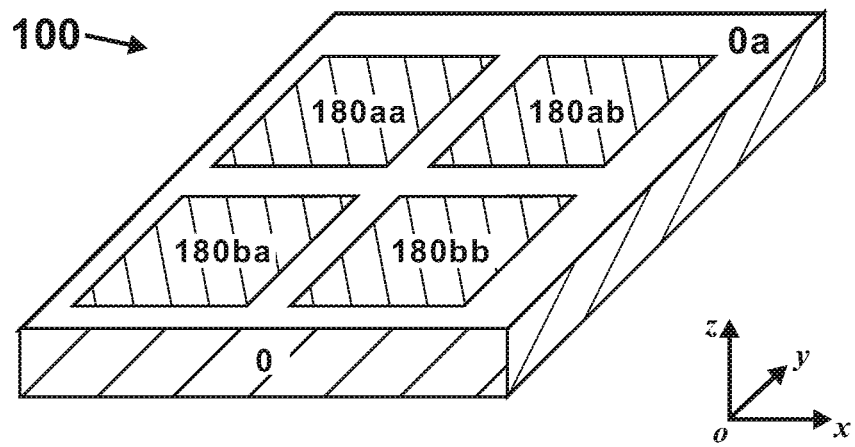
FIGS. 6A-6C are different views of a preferred bi-sided neuro-processor.
Figure 6B:
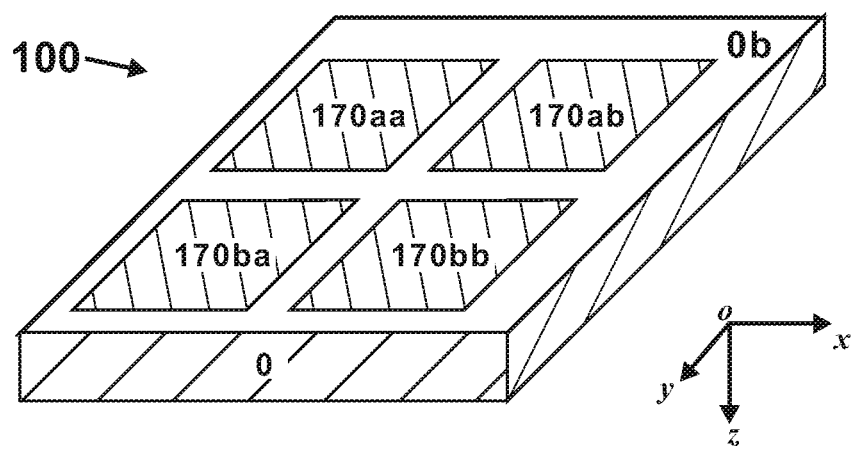
Figure 6C:
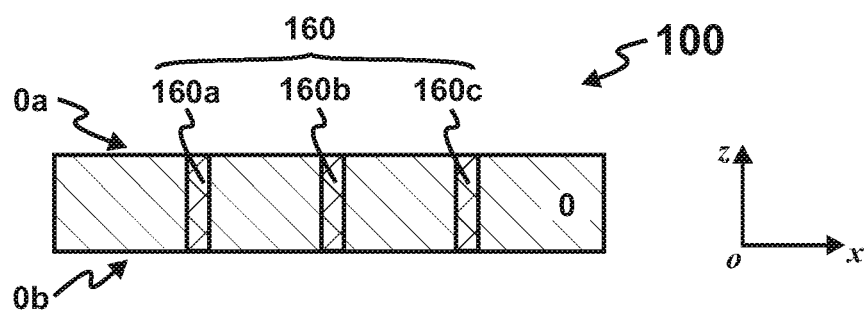

Referring now to FIGS. 6A-6C, a preferred bi-sided neuro-processor 100 is shown. The preferred bi-sided neuro-processor 100 comprises a semiconductor substrate 0 with a first die 0a and a second side 0b. The first surface 0a comprises the neuro-processing circuits 180aa-180bb . . . (FIG. 6A). On the other hand, the second surface 0b comprises the memory arrays 170aa-170bb . . . (FIG. 6B). They are communicatively coupled by a plurality of inter-level connections 160, i.e. through-silicon vias (TSV's) 160a-160c (FIG. 6C). These TSV's 160a-160c penetrate through the substrate 0 and form electrical connections between circuits disposed on different surfaces 0a, 0b.

The type of vertical integration in FIGS. 6A-6C is referred to as double-sided integration. It also has a profound effect on the computational density. Because the memory array 170 is vertically stacked above the neuro-processing circuit 180 (FIGS. 5A-5C), the footprint of an NSPU 100ij is roughly equal to that of the neuro-processing circuit 180. This is significantly smaller than prior art. Similarly, after moving the memory array from aside (i.e. 2-D integration) to above (i.e. double-sided integration), the NSPU 100ij could be ~10× smaller than the tile 50 of prior art. Because it could contain ~10× more NSPU's per die area than prior art, the bi-sided neuro-processor 100 is ~10× more computationally powerful and supports more massive parallelism.

Referring now to FIGS. 7A-7D, four preferred neuro-processor packages 100 are shown with focus on the implementations of inter-level connections 160. The preferred neuro-processor package 100 comprises a first die 100a (also known as a memory die) and a second die 100b (also known as a logic die), with the first die 100a comprising the memory arrays 170 and the second die 100b comprising the neuro-processing circuits 180.

Figure 7A:
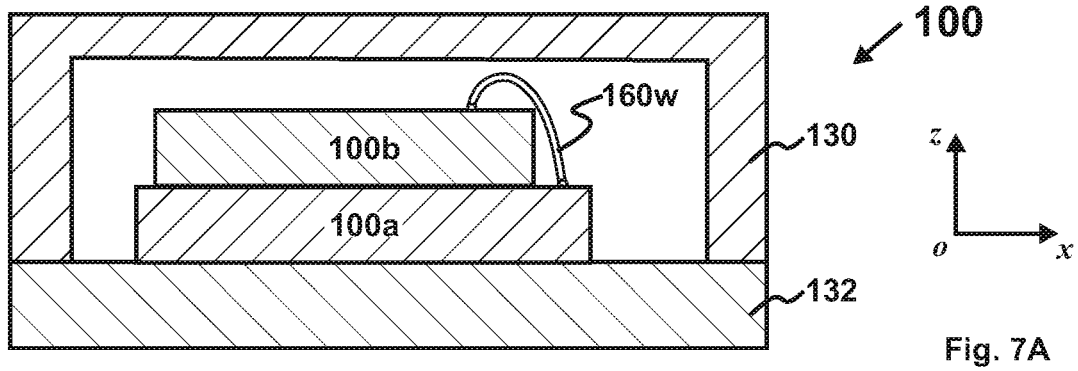
FIGS. 7A-7D are cross-sectional views of four preferred neuro-processor packages.

In FIG. 7A, the first and second dice 100a, 100b are vertically stacked, i.e. stacked along the direction perpendicular to the dice 100a, 100b. Both the first and second dice 100a, 100b face upward (i.e. along the +z direction). They are communicatively coupled through the bond wires 160w, which realize the Inter-level connections 160.

Figure 7B:
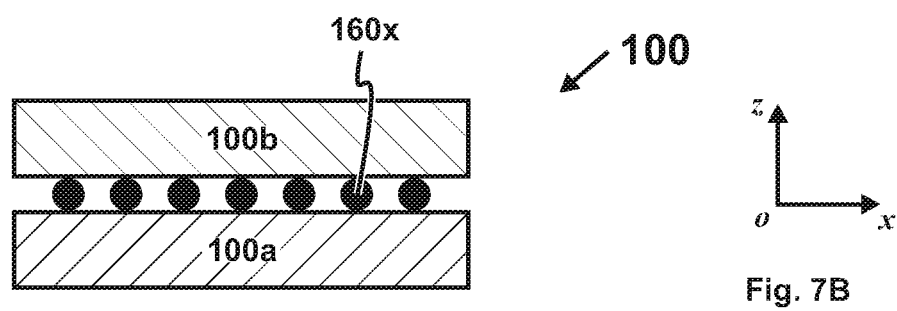

In FIG. 7B, the first and second dice 100a, 100b are placed face-to-face, i.e. the first die 100a faces upward (i.e. along the +z direction), while the second die 100b is flipped so that it faces downward (i.e. along the −z direction). They are communicatively coupled by the micro-bumps 160x, which realize the Inter-level connections 160.

Figure 7C:
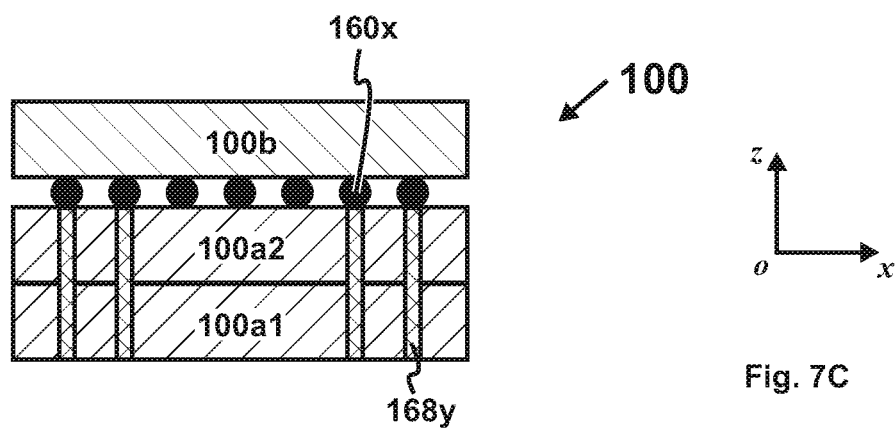

The preferred embodiment of FIG. 7C comprises two memory dice 100a1, 100a2 and a logic die 100b. To avoid confusion, the dice 100a1, 100a2 are referred to as memory dice instead of first dice; and, the die 100b is referred to as the logic die instead of the second die. Each of the memory dice 100a1, 100a2 comprises a plurality of memory arrays 170. The memory dice 100a1, 100a2 are vertically stacked and communicatively coupled by the through-silicon vias (TSV's) 160y. The stack of the memory dice 100a1, 100a2 is communicatively coupled with the logic die 100b by the micro-bumps 160x. The TSV's 160y and the micro-bumps 160x realize the inter-level connections 160.

Figure 7D:
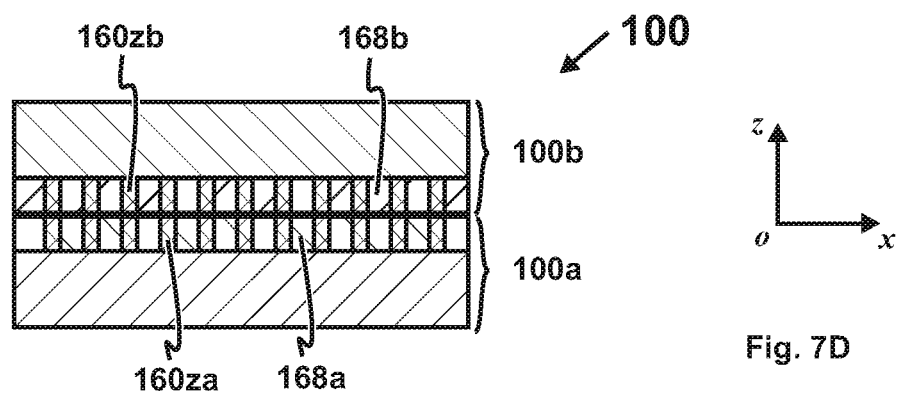

In FIG. 7D, a first dielectric layer 168a is deposited on top of the first die 100a and first vias 160za are etched in the first dielectric layer 168a. Then a second dielectric layer 168b is deposited on top of the second die 100b and second vias 160zb are etching in the second dielectric layer 168b. After flipping the second die 100b and aligning the first and second vias 160za, 160zb, the first and second dice 100a, 100b are bonded. Finally, the first and second dice 100a, 100b are communicatively coupled by the contacted first and second vias 160za, 160zb, which realizes the Inter-level connections 160. Because they can be made with the standard manufacturing process, the first and second vias 160za, 160zb are small and numerous. As a result, the Inter-level connections 160 have a large bandwidth. In this preferred embodiment, the first and second vias 160za, 160zb are collectively referred to as vertical interconnect accesses (VIA's).

The type of vertical integration in FIGS. 7A-7D is referred to as 2.5-D integration. For the 2.5D-integration, the memory array 170 and the neuro-processing circuit 180 are close (relative to the conventional von Neumann architecture). In addition, for the embodiments of FIGS. 7B-7D, more particularly for the embodiments of FIGS. 7C-7D, the inter-level connections (e.g. TSV's, or VIA's) 160 are numerous. They can realize a large bandwidth between the memory array 170 and the neuro-processing circuit 180. Adding massive parallelism (FIG. 2A), the preferred neuro-processor packages 100 can achieve great performance.

In the preferred embodiments of FIGS. 6A-6C and FIGS. 7A-7D, the memory array 170 could be a RAM array or a ROM array. The RAM array could be an SRAM array or a DRAM array. The ROM array could be a mask-ROM array, an OTP array, an EPROM array, an EEPROM array, a flash memory array or a 3-D memory (3D-M) array.

Figure 8B:
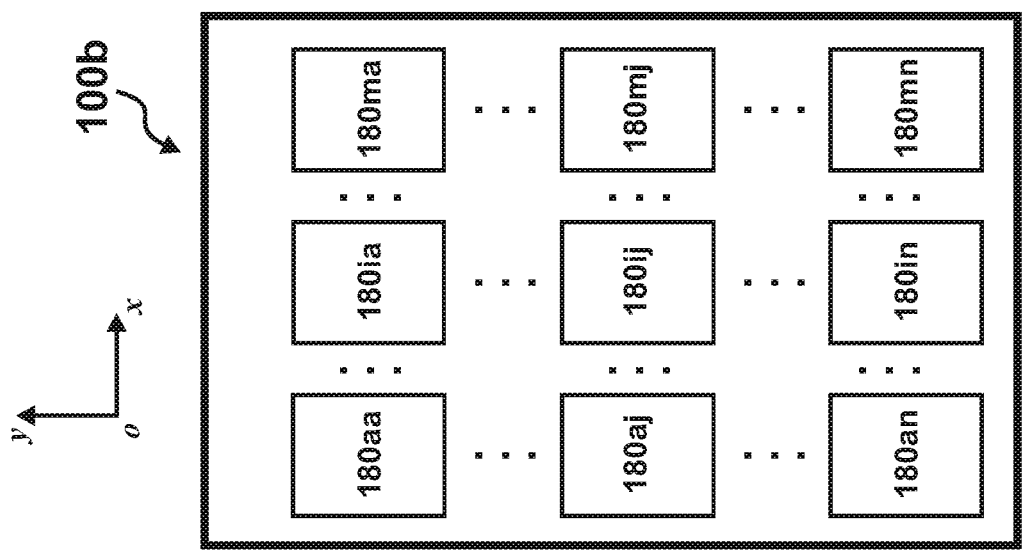
FIG. 8B is a circuit block layout of a preferred logic level.
Figure 8A:
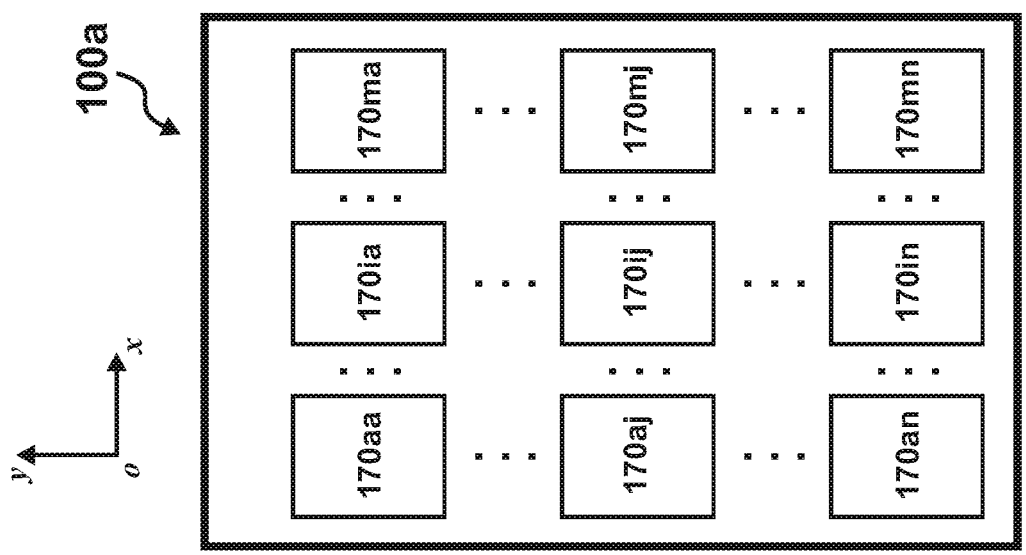
FIG. 8A is a circuit block layout of a preferred memory level.

Referring now to FIGS. 8A-8B, the circuit layouts on the preferred memory level 100a and the preferred logic level 100b are shown. The preferred embodiment in these figures corresponds to that in FIG. 9A and FIG. 10A. To those skilled in the art, these layout designs can be easily extended to those in FIG. 9B and FIG. 10B, as well as FIG. 9C And FIG. 10C.

In FIG. 8A, the preferred memory level 100a comprises a plurality of memory arrays 170aa-170mn. In FIG. 8B, the preferred logic level 100b comprises a plurality of neuro-processing circuits 180aa-180mn. The preferred neuro-processor 100 in FIG. 8A and FIG. 8B adopts an "all-matching" design, i.e. the circuits on the memory level 100a and the logic level 100b are designed in such a way that each memory array (e.g. 170ij) is vertically aligned and communicatively coupled with a selected one of the neuro-processing circuit (e.g. 180ij). Because each neuro-processing circuit (e.g. 180ij) is vertically aligned and communicatively coupled with multiple memory arrays (e.g. 170ijA-170ijD, 170ijW-170ijZ) (referring to FIGS. 10B-10C), the pitch of the neuro-processing circuit (e.g. 180ij) on the logic level 100b is an integer multiple of that of the memory array (e.g. 170ij) on the memory level 100a.

Figure 9A:
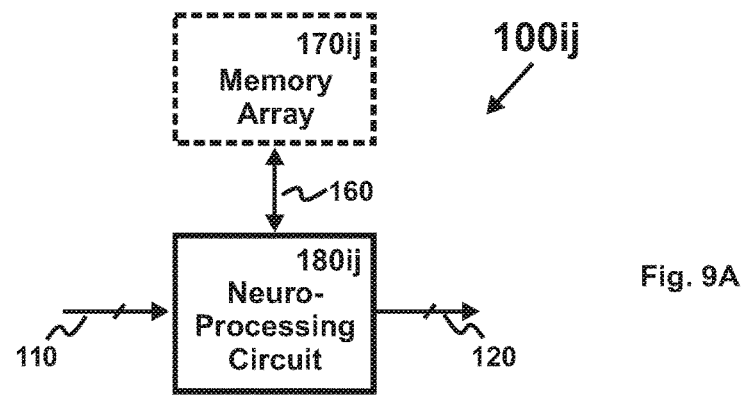
FIGS. 9A-9C are circuit block diagrams of three preferred NSPU's.
Figure 9B:
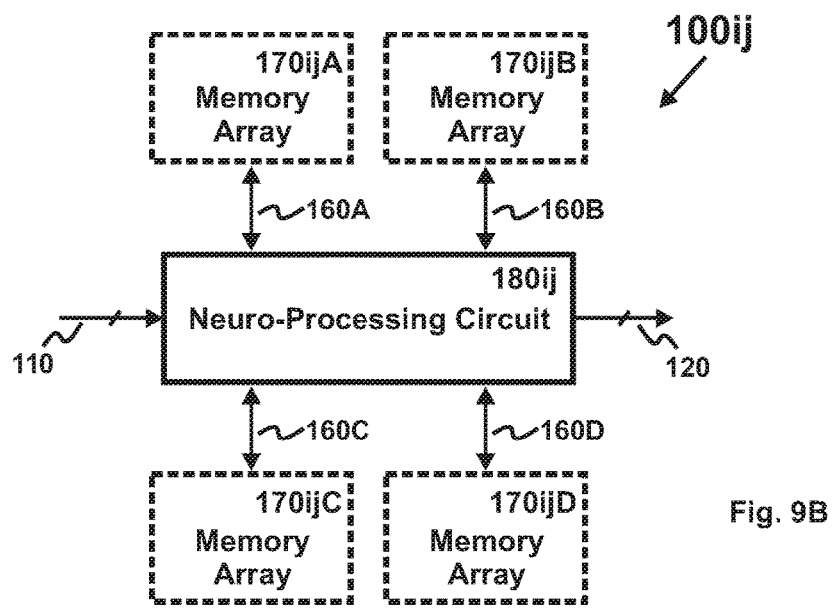
Figure 9C:
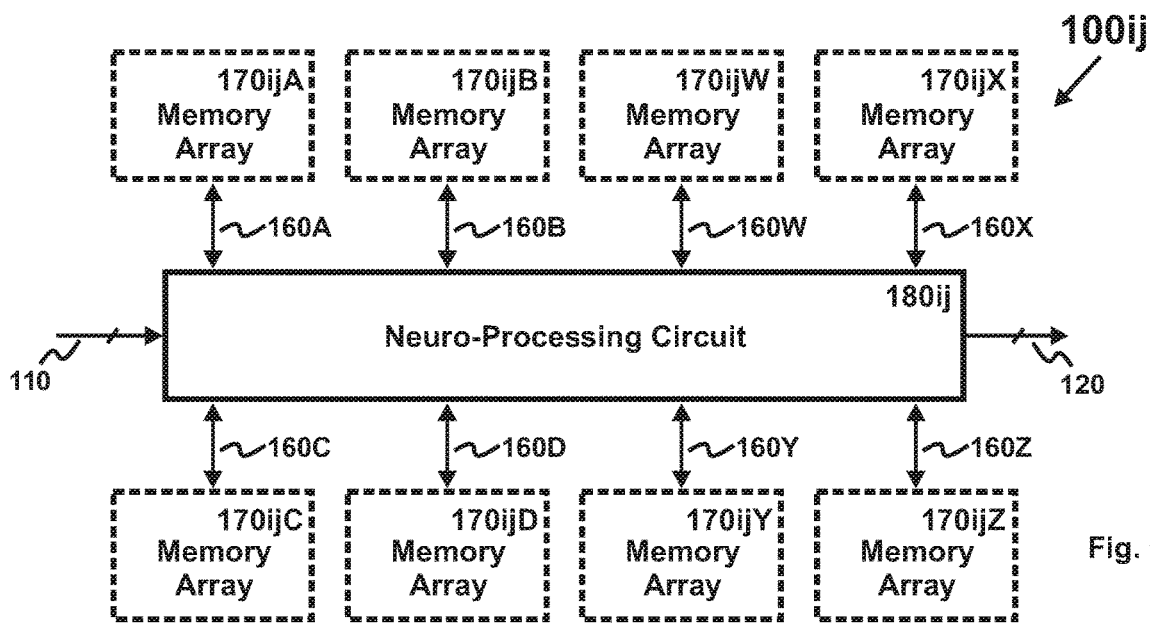
Figure 10A:
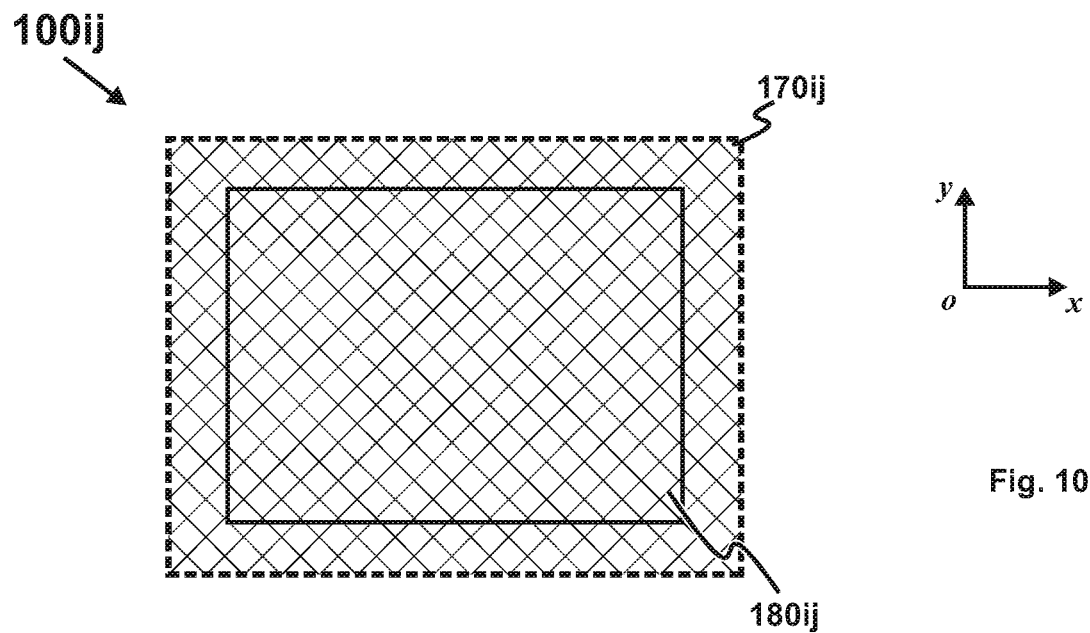
FIGS. 10A-10C are circuit layout views of three preferred NSPU's on the logic level.
Figure 10B:
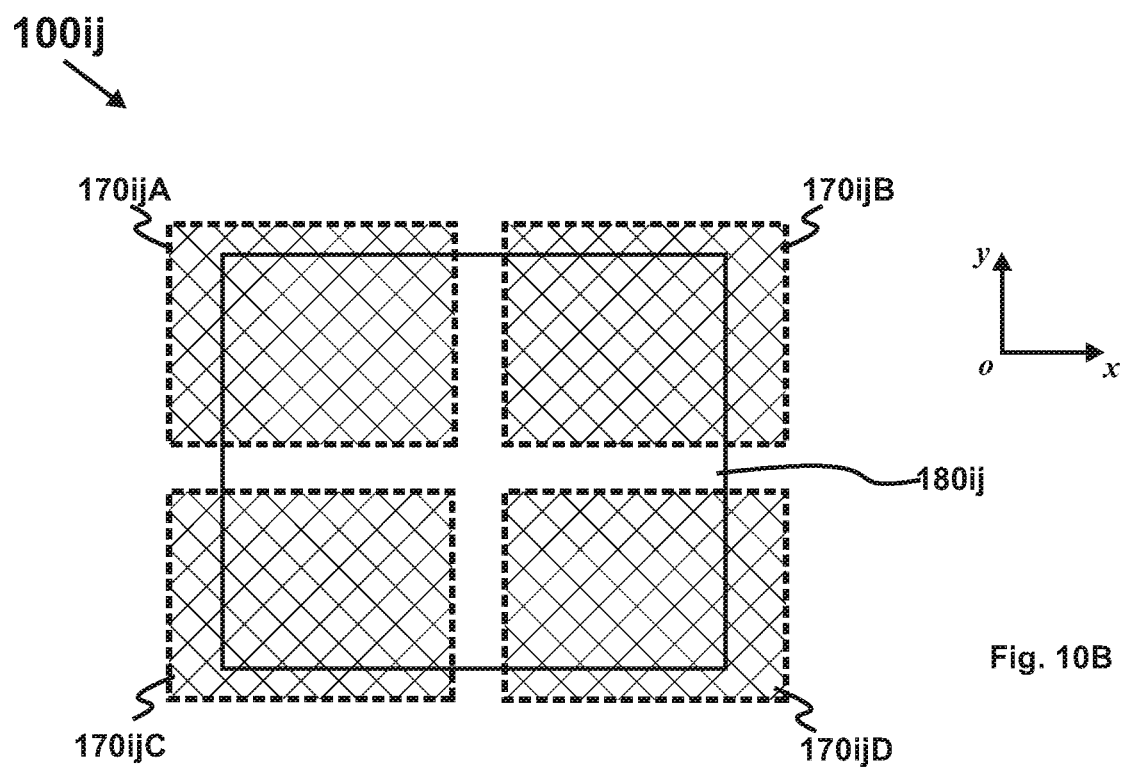
Figure 10C:
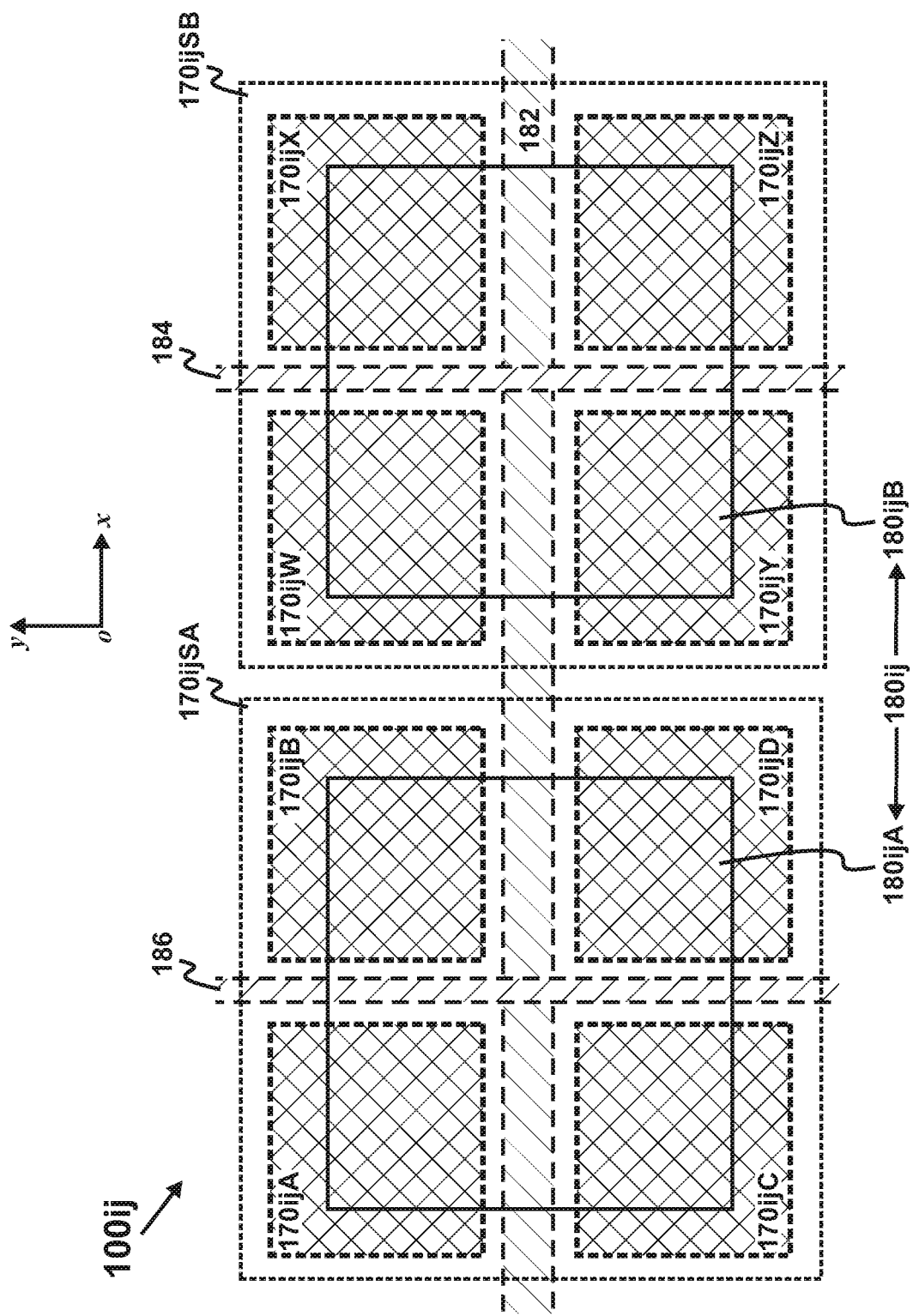

Referring now to FIGS. 9A-10C, three preferred NSPU's 100ij are shown. FIGS. 9A-9C are their circuit block diagrams and FIGS. 10A-10C are their circuit layout views. In these preferred embodiments, a neuro-processing circuit 180ij uses the synaptic weights stored in different number of memory arrays 170ij.

In FIG. 9A, the neuro-processing circuit 180ij serves one memory array 170ij, i.e. it uses the synaptic weights stored in the memory array 170ij. In FIG. 9B, the neuro-processing circuit 180ij serves four memory arrays 170ijA-170ijD, i.e. it uses the synaptic weights stored in the memory arrays 170ijA-170ijD. In FIG. 9C, the neuro-processing circuit 180ij serves eight memory array 170ijA-170ijD, 170ijW-170ijZ, i.e. it uses the synaptic weights stored in the memory array 170ijA-170ijD, 170ijW-170ijZ. As will become apparent in FIGS. 8A-8C, the more memory arrays it serves, a larger area and more functionalities the neuro-processing circuit 180ij will have. In FIGS. 9A-10C, because they are located on a different level 100a than the neuro-processing circuit 180ij, the memory arrays 170ij-170ijZ are drawn by dashed lines.

FIGS. 10A-10C disclose the circuit layouts on the logic level 100b, as well as the projections of the memory arrays 170 (physically located on the memory level 100a) on the logic level 100b (drawn by dashed lines). The embodiment of FIG. 10A corresponds to that of FIG. 9A. In this preferred embodiment, the neuro-processing circuit 180ij is at least partially covered by the memory array 170ij.

In this preferred embodiment, the pitch of the neuro-processing circuits 180ij is equal to the pitch of the memory arrays 170ij. Because its area is smaller than the footprint of the memory array 170ij, the neuro-processing circuit 180ij has limited functionalities. FIGS. 10B-10C discloses two complex neuro-processing circuits 180ij.

The embodiment of FIG. 10B corresponds to that of FIG. 9B. In this preferred embodiment, the neuro-processing circuit 180ij is at least partially covered by the memory arrays 170ijA-170ijD. Below the four memory arrays 170ijA-170ijD, the neuro-processing circuit 180ij can be laid out freely. Because the pitch of the neuro-processing circuit 180ij is twice as much as the pitch of the memory arrays 170ij, the neuro-processing circuit 180ij is four times larger than the footprints of the memory arrays 170ij and therefore, has more complex functionalities.

The embodiment of FIG. 10C corresponds to that of FIG. 9C. In this preferred embodiment, the memory arrays 170ijA-170ijD, 170ijW-170ijZ are divided into two sets: a first set 170ijSA includes four memory arrays 170ijA- 170*ij*D, and a second set 170*ij*SB includes four memory arrays 170*ij*W-170*ij*Z. Below the four memory arrays 170*ij*A-170*ij*D of the first set 170*ij*SA, a first component 180*ij*A of the neuro-processing circuit 180*ij* can be laid out freely. Similarly, below the four memory array 170*ij*W-170*ij*Z of the second set 170*ij*SB, a second component 180*ij*B of the neuro-processing circuit 180*ij* can be laid out freely. The first and second components 180*ij*A, 180*ij*B collectively form the neuro-processing circuit 180*ij*. In this embodiment, the routing channel 182, 184, 186 are formed to provide coupling between different components 180*ij*A, 180*ij*B, or between different neuro-processing circuits. Because the pitch of the neuro-processing circuit 180*ij* is four times as much as the pitch of the memory arrays 170*ij*(along the x direction), the neuro-processing circuit 180*ij* is eight times larger than the footprints of the memory arrays 18*ij* and therefore, has even more complex functionalities.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A vertically integrated neuro-processor, comprising:
   a plurality of neural storage-processing units (NSPU's), each of said NSPU's comprising at least a neuro-storage circuit and a neuro-processing circuit, wherein said neuro-storage circuit comprises at least a memory array for storing at least a portion of a synaptic weight, and said neuro-processing circuit performs neural processing with said synaptic weight;
   a memory level and a logic level, wherein said memory array is disposed on said memory level, said neuro-processing circuit is disposed on said logic level, said memory level and said logic level are vertically stacked and communicatively coupled by a plurality of inter-level connections;
   wherein, said neuro-processing circuit further comprises a three-dimensional read-only memory (3D-ROM) stacked above a multiplier for storing a look-up table (LUT) of an activation function.

2. The neuro-processor according to claim 1, wherein the projection of said memory array on said logic level at least partially overlaps said neuro-processing circuit.

3. The neuro-processor according to claim 1, wherein each memory array is vertically aligned and communicatively coupled with a neuro-processing circuit.

4. The neuro-processor according to claim 1, wherein each neuro-processing circuit is vertically aligned and communicatively coupled with at least a memory array.

5. The neuro-processor according to claim 1 further comprising a single semiconductor substrate, wherein:
   said neuro-processing circuit is disposed on said semiconductor substrate;
   said memory array is a three-dimensional memory (3D-M) array stacked above said neuro-processing circuit; and,
   said neuro-processing circuit and said 3D-M array are communicatively coupled by a plurality of contact vias.

6. The neuro-processor according to claim 1 further comprising a semiconductor substrate with first and second sides, wherein:
   said neuro-processing circuit is disposed on said first side;
   said memory array is disposed on said second side; and,
   said neuro-processing circuit and said memory array are communicatively coupled by a plurality of through-silicon vias (TSV's).

7. The neuro-processor according to claim 1, comprising:
   a first die comprising said memory array;
   a second die comprising said neuro-processing circuit;
   said neuro-processing circuit and said memory are communicatively coupled by a plurality of inter-die connections.

8. The neuro-processor according to claim 1, comprising:
   a first die comprising said memory array;
   a second die comprising said neuro-processing circuit;
   said first and second dice are placed face-to-face and coupled with a plurality of inter-die connections.

* * * * *